United States Patent
Zundel et al.

(10) Patent No.: US 9,443,807 B2
(45) Date of Patent: Sep. 13, 2016

(54) SEMICONDUCTOR DEVICE AND METHOD FOR MANUFACTURING A SEMICONDUCTOR DEVICE

(71) Applicant: Infineon Technologies AG, Neubiberg (DE)

(72) Inventors: Markus Zundel, Egmating (DE); Thomas Ostermann, Velden / Woerthersee (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/020,117

(22) Filed: Sep. 6, 2013

(65) Prior Publication Data
US 2015/0069394 A1 Mar. 12, 2015

(51) Int. Cl.
H01L 23/58 (2006.01)
H01L 23/544 (2006.01)
H01L 21/66 (2006.01)
H01L 21/784 (2006.01)
H01L 29/06 (2006.01)

(52) U.S. Cl.
CPC ............ *H01L 23/544* (2013.01); *H01L 21/784* (2013.01); *H01L 22/12* (2013.01); *H01L 22/34* (2013.01); *H01L 29/0657* (2013.01); *H01L 2223/5446* (2013.01); *H01L 2223/54426* (2013.01); *H01L 2224/94* (2013.01); *H01L 2924/0002* (2013.01); *H01L 2924/10253* (2013.01); *H01L 2924/10271* (2013.01); *H01L 2924/10272* (2013.01); *H01L 2924/10329* (2013.01); *H01L 2924/13055* (2013.01); *H01L 2924/13062* (2013.01); *H01L 2924/13091* (2013.01); *H01L 2924/141* (2013.01); *H01L 2924/1431* (2013.01); *H01L 2924/1434* (2013.01)

(58) Field of Classification Search
CPC ........... H01L 29/0657; H01L 29/0661; H01L 23/544; H01L 22/12
USPC ......................................... 257/620; 438/462
See application file for complete search history.

(56) References Cited

U.S. PATENT DOCUMENTS

| | | | |
|---|---|---|---|
| 2004/0259346 A1* | 12/2004 | Fukasawa | H01L 21/56 438/614 |
| 2005/0173024 A1* | 8/2005 | Brennan | H01L 21/30608 148/33.2 |
| 2006/0278956 A1* | 12/2006 | Cadouri | 257/620 |
| 2009/0093104 A1* | 4/2009 | Arita et al. | 438/462 |
| 2009/0278265 A1* | 11/2009 | Imanishi | H01L 21/56 257/787 |
| 2011/0227201 A1* | 9/2011 | Too et al. | 257/618 |
| 2011/0241174 A1* | 10/2011 | Takei | H01L 27/1214 257/618 |
| 2014/0232006 A1* | 8/2014 | Vielemeyer | 257/773 |

* cited by examiner

Primary Examiner — Tu-Tu Ho
(74) Attorney, Agent, or Firm — Murphy, Bilak & Homiller, PLLC (57) ABSTRACT

A device includes a semiconductor chip. An outline of a frontside of the semiconductor chip includes at least one of a polygonal line including two line segments joined together at an inner angle of greater than 90° and an arc-shaped line.

12 Claims, 6 Drawing Sheets

SEMICONDUCTOR DEVICE AND METHOD FOR MANUFACTURING A SEMICONDUCTOR DEVICE

TECHNICAL FIELD

The disclosure relates to semiconductor devices and methods for manufacturing semiconductor devices.

BACKGROUND

The fabrication of semiconductor devices may include a dicing of a semiconductor wafer, wherein the dicing process may damage the semiconductor material. In addition, semiconductor devices may be damaged during operation. It may be desirable to improve the performance and the quality of semiconductor devices. In particular, it may be desirable to avoid damage of the semiconductor devices during fabrication and operation.

SUMMARY

According to an embodiment of a device, the device comprises a semiconductor chip. An outline of a frontside of the semiconductor chip comprises at least one of a polygonal line comprising two line segments joined together at an inner angle of greater than 90° and an arc-shaped line.

According to another embodiment of a device, the device comprises a semiconductor chip comprising a frontside, a backside and a side surface extending from the backside to the frontside. The side surface comprises at least one of a curved surface and an edge having an inner angle of greater than 90°.

According to an embodiment of a method, the method comprises: forming at least one semiconductor chip on a semiconductor wafer; and separating the at least one semiconductor chip, wherein an outline of a frontside of the separated semiconductor chip comprises at least one of a polygonal line comprising two line segments joined together at an inner angle of greater than 90° and an arc-shaped line.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, which form a part hereof, and in which is shown by way of illustration specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in noway limiting. Other aspects may be utilized and structural or logical changes may be made without departing from the scope of the present disclosure. The following detailed description, therefore, is not to be taken in a limiting sense, and the scope of the present disclosure is defined by the appended claims.

As employed in this specification, the terms "coupled" and/or "electrically coupled" are not meant to mean that the elements must be directly coupled together. Intervening elements may be provided between the "coupled" or "electrically coupled" elements.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

Devices in accordance with the disclosure may include one or more semiconductor chips. The semiconductor chips may be of different types and may be manufactured using different technologies. For example, the semiconductor chips may include integrated electrical, electro-optical or electro-mechanical circuits, or passives. The integrated circuits may be designed as logic integrated circuits, analog integrated circuits, mixed signal integrated circuits, power integrated circuits, memory circuits, integrated passives, or micro-electro mechanical systems. The semiconductor chips need not be manufactured from a specific semiconductor material. For example, the semiconductor chip may include at least one of Si, SiC, SiGe, GaAs. In addition, the semiconductor chips may contain inorganic and/or organic materials that are not semiconductors, such as, for example, insulators, plastics or metals. The semiconductor chips may be packaged or unpackaged and may be of arbitrary dimension. In particular, a thickness of the semiconductor chips may be smaller than or equal to 100 μm (micrometer).

The semiconductor chips may particularly include one or more power semiconductors. The semiconductor chips (or power semiconductor chips) may have a vertical structure, i.e. the semiconductor chips may be fabricated such that electric currents may flow in a direction perpendicular to the main faces of the semiconductor chips. A semiconductor chip having a vertical structure may have electrodes on its two main faces, i.e. on its top side and bottom side. In particular, power semiconductor chips may have a vertical structure and may have load electrodes on both main faces. For example, the vertical power semiconductor chips maybe configured as power MOSFETs (Metal Oxide Semiconductor Field Effect Transistors), IGBTs (Insulated Gate Bipolar Transistors), JFETs (Junction Gate Field Effect Transistors), super junction devices, power bipolar transistors, etc. The source electrode and gate electrode of a power MOSFET may be situated on one face, while the drain electrode of the power MOSFET may be arranged on the other face. Devices in accordance with the disclosure may further include integrated circuits configured to control the integrated circuits of the power semiconductor chips.

The terms "frontside" and "backside" of a semiconductor chip or a semiconductor wafer may be used herein. The term "frontside" may particularly refer to a main face of the semiconductor chip that may include at least one of a doped region, an electrical component, a microelectronic component, an integrated circuit, etc. Semiconductor chips may be manufactured from a semiconductor wafer that may serve as a substrate for microelectronic devices to be built in and over the semiconductor wafer. The integrated circuits may be manufactured by doping, ion implantation, deposition of materials, photolithographic patterning, etc. The manufacturing processes usually may be performed on a specific main surface of the semiconductor wafer which may also be referred to as the "frontside" of the semiconductor wafer. After separating the individual semiconductor chips from the semiconductor wafer, the "frontside" of the semiconductor wafer may consequently become the "frontside" of the separated semiconductor chips.

The term "backside" of a semiconductor chip may refer to a main surface of the semiconductor chip that may be arranged opposite to the frontside of the semiconductor chip. The backside of the semiconductor chip may be free of electronic components, i.e. it may mainly consist of the semiconductor material. Even though the backside of the semiconductor chip may not be processed similar to the frontside of the semiconductor chip, the backside may include contact pads providing an electrical coupling to inner electronic structures of the semiconductor chip. The frontside and the backside of the semiconductor chip may be connected by at least one side surface extending from the frontside to the backside.

A dicing process may be employed for manufacturing devices in accordance with the disclosure. In particular, the dicing process may be used to separate a semiconductor wafer into multiple semiconductor chips. In this connection, a suitable dicing technique may be applied, for example laser dicing, wet etching, etching, sputter etching, vapor phase etching, plasma etching, etc. An etching process may be performed before or after a thinning of the semiconductor wafer. In the latter case, an etched trench may extend from the frontside of the semiconductor wafer to the backside of the semiconductor wafer. In the former case, a trench may be etched on the frontside of the semiconductor wafer, wherein the trench may not necessarily extend completely to the backside of the semiconductor wafer. The semiconductor wafer may then be thinned by removing semiconductor material from the backside of the semiconductor wafer until the semiconductor wafer is separated at the position of the previously formed trench.

The term "plasma etching" may refer to any suitable etching or dicing process employing a plasma, for example Reactive Ion Etching, Deep Reactive Ion Etching, Ion Beam Etching, etc. In plasma etching, a semiconductor wafer may be masked with a mask material, thereby leaving open areas between the individual semiconductor chips (or dies). The masked semiconductor wafer may then be processed using a reactive-gas plasma that may etch the semiconductor wafer material exposed between the semiconductor chips. Plasma etching may be performed by ionizing a gas mix inside a chamber to obtain ions that may react with the target material. An ionization of employed gases may be performed using a radio frequency excitation emitted by an electrode. A used plasma source (or etch species) may be charged (ions) and/or neutral (atoms and radicals). During a plasma etching process, the plasma may generate volatile etch products from chemical reactions between the elements of the material to be etched and the reactive species generated by the plasma. Atoms of the treated element may embed themselves on or below the surface of the target material such that the physical properties of the target material may be modified.

Chemistries of gases used in a plasma etching process may particularly depend on the material to be etched. For example, a halogen (fluorine, chlorine, bromine, or iodine) gas or halogen-containing gas may be used, wherein one or more additional gases may be added in order to improve a quality of an etch (e.g. etch anisotropy, mask selectivity, etch uniformity, etc.). For example, gases including fluorine, such as e.g. $SF_6$, $F_2$ or $NF_3$, may be used for etching silicon. Gases including chlorine and/or bromine may be used for etching III-V materials.

In wet etching, an etchant may be used to separate a semiconductor wafer into multiple semiconductor chips. A mask may be used to selectively remove material from the target material. A wet etching process may be isotropic such that an etching rate may be identical in both horizontal and vertical direction. Alternatively, a wet etching process may be anisotropic such that an etching rate may be different in a horizontal and a vertical direction. In one example, a wet etching process may use hydrofluoric acid.

Semiconductor chips included in devices in accordance with the disclosure may have an undulation that may particularly be located at one or more side surfaces of the semiconductor chips. For example, the side surfaces of the semiconductor chip may undulate with an amplitude from about 100 nm to about 5 μm (micrometer), and more particular from about 100 nm to about 500 nm. The undulations may result from a plasma etching process that may have been used to separate the semiconductor chip from a semiconductor wafer. For example, a time-modulated two-phase etching process may be employed to etch grooves into the semiconductor wafer at the positions where the semiconductor wafer is to be separated. The process may include a first phase, in which an isotropic plasma etching step may be performed, and a second phase, in which a passivation layer that may be configured to protect the side walls of the groove during the etching step may be deposited. The etching act of the first phase and the depositing act of the second phase may be repeated multiple times resulting in multiple etching acts taking place at the bottom of the groove leading to the mentioned undulation (or wave form or wave shape) of the side surfaces. For example, the acts of the first and second phase may be repeated 10 times to 100 times. The amplitude of the undulation as well as the depth of the etched groove 9 may particularly depend on the number of repetitions of the acts of the first and second phase. In particular, the amplitude of the undulation may decrease with an increased number of repetitions (for a given thickness of the semiconductor wafer to be etched).

Using processes like sawing or laser dicing for separating the semiconductor wafer may result in damage of the semiconductor material at the side surfaces of the semiconductor chip. Such damage may at least partly be avoided by employing an etching process for separating the semiconductor wafer. In one example, the side surfaces of the semiconductor chips may remain free of defects extending from the side surfaces into the semiconductor material. In another example, defects extending from the side surfaces into the semiconductor material may occur, wherein a dimension of the defects may be smaller than 20 μam (micrometer), more particular smaller than 10 μm (micrometer), and even more particular smaller than 5 μm (micrometer). Contrarily, applying e.g. a mechanical or laser dicing technique for separating the semiconductor wafer may result in defects of the semiconductor material extending from the side surfaces into the separated semiconductor chips. Directly after the dicing process, these defects may have a dimension of about a few micrometer up to about 100 μm (micrometer). After further thermal stress and/or application stress that may occur during further manufacturing steps and/or an operation of the separated semiconductor chips, the defects may increase up to several hundreds of micrometer.

Scribe lines may be employed for manufacturing devices in accordance with the disclosure. The scribe lines may be arranged between the semiconductor chips (or dies) on the frontside of a semiconductor wafer and may indicate locations where the semiconductor wafer is to be separated into the individual semiconductor chips by a dicing process. In particular, the scribe lines may be free of metal that has been used during a fabrication of electronic structures of the semiconductor chips. The scribe lines may have a width from about 5 μm (micrometer) to about 100 μm (micrometer), and more particular from about 15 μm (micrometer) to about 50 μm (micrometer). The width of the scribe lines may particularly depend on alignment properties and/or a sensitivity of the semiconductor chips and/or alignment properties of employed lithography levels. Referring back to the previously described plasma etching process and wet etching process, a layout of the scribe lines may be similar to a layout of an etching mask used for the etching process.

Devices in accordance with the disclosure may include an optically detectable alignment structure which may particularly be arranged over (or on) the frontside of a semiconductor chip. The alignment structure may be configured to support an alignment of the semiconductor chip or a semiconductor wafer including the semiconductor chip. For example, the alignment structure may include a three-dimensional object. The alignment structure may have a dimension of at least 5 μm (micrometer), more particular of at least 20 μm (micrometer), more particular of at least 30 μm (micrometer), and more particular of at least 40 μm (micrometer). In this regard, the term "dimension" may refer to a maximum extent of the alignment structure. When having one of the above-mentioned dimensions, the alignment structure may be identified or detected by employing usual image data processing tools. This way, an employment of more complicated tools, such as e.g. a high performance microscope, may be avoided. The alignment structure may be formed from an arbitrary material and may be of arbitrary shape. For example, the identification mark may include at least one of a letter, a number, a shape, and a symbol. The alignment structure may be formed from at least one of a semiconductor material, a dielectric material, a polymer, a plastic material, a metal, an alloy, etc.

Devices in accordance with the disclosure may include a structure configured to support a measurement of electronic properties of a semiconductor chip of the device. The measurement structure may be particularly arranged over (or on) the frontside of the semiconductor chip. In one example, the measurement structure may include an electrically active element such as e.g. a contact pad. A contact pad may be used as an input and/or an output for electrical signals that may be used for testing an inner electronic structure of the semiconductor chip. For this purpose, the contact pad may be electrically coupled to an external pin that may be configured to provide the electrical signals. For example, the test pad may be used to test whether the semiconductor chip (or die) meets critical electrical parameters. In general, the measurement structure may include any electrical component that may be configured to support a test of the electrical properties of the semiconductor chip.

Sacrificial structures may be used during a fabrication of devices in accordance with the disclosure. The sacrificial structures may be formed in a scribe lines or in a crossing area of scribe lines. The structures may be termed "sacrificial", because at least a part of the structures may be destroyed during a separation of the semiconductor wafer. In one example, the sacrificial structures may be destroyed completely during the dicing process such that the separated semiconductor chips may be completely free of sacrificial structures. In another example, only parts of the sacrificial structures may be destroyed during the dicing process such the separated semiconductor chips may at least partly include remaining parts of the sacrificial structures. The remaining parts may at least partly be damaged. Examples for sacrificial structures are given in the following.

During a fabrication of devices in accordance with the disclosure a monitoring structure may be formed. The monitoring structure may be a sacrificial structure and may particularly be formed in a scribe line or a crossing of scribe lines. The monitoring structure may be configured to monitor a fabrication of the devices and may particularly be formed before the semiconductor wafer is separated into multiple semiconductor chips.

For example, the monitoring structure may include a Process Control Monitoring (PCM) structure. A PCM structure may be formed in parallel with an integrated circuit semiconductor component whose production shall be monitored. By applying identical acts for manufacturing the semiconductor component and the PCM structure, the formed PCM structure may be similar to the semiconductor components formed on a respective die. The PCM structure and the semiconductor component to be monitored may therefore have similar electronic properties. That is, passing an electrical signal through the circuitry of the PCM structure may provide an output signal that may be analyzed for monitoring purposes. A semiconductor wafer may include multiple reticle shots wherein each reticle shot may include multiple semiconductor chips (or dies). For example, one PCM structure may be employed for monitoring the production of semiconductor chips of one reticle shot. The monitoring data may thus be collected from only one PCM site, instead of any individual semiconductor chip of the reticle shot. The monitoring data may be used for deciding whether it may be reasonable for a semiconductor wafer to be further processed or not. If signals provided by the PCM structure do not comply with predetermined process specifications, it may be possible that most of the semiconductor chips may fail or may not function properly later on.

Manufacturing devices in accordance with the disclosure may include forming an auxiliary structure. The auxiliary structure may be a sacrificial structure and may particularly be formed in a scribe line or in a crossing of scribe lines. In general, an auxiliary structure may be configured to improve and support a manufacturing of the semiconductor chips, in particular on wafer level. Exemplary auxiliary structures are described in the following.

An auxiliary structure may include one or more optically detectable (sacrificial) alignment structures. In one example, the sacrificial alignment structure may be similar to the alignment structures arranged over the frontside of a semiconductor chip as previously described. However, the alignment structures may differ in their dimensions. The sacrificial alignment structure may particularly be configured to support an alignment of the semiconductor wafer. For example, a (lateral) dimension of the sacrificial alignment structure in a direction parallel to the frontside of the semiconductor wafer may be in the same range as a lateral dimension of the semiconductor chips. For example, the lateral dimension of a set of alignment structures may lie in a range from about 0.5 mm to about 10 mm. The sacrificial alignment structure may be detected by employing usual image data processing tools or optical detection systems.

The position of a sacrificial alignment structure may be exactly defined in relation to the nominal positions of the array of semiconductor chips of the semiconductor wafer. In one example, a surface of a sacrificial alignment structure may be provided with a line pattern. The line pattern may comprise geometric elements such as e.g. concentric circles, rhombuses and/or a cross line pattern. For example, a cross line pattern may define a specific point in the plane of the semiconductor wafer which may serve as a reference point established by the sacrificial alignment structure. The other geometric elements or patterns may be configured to facilitate the location and detection of the cross line pattern.

An auxiliary structure may include one or more dummy trenches. Forming integrated circuits of the individual semiconductor chips of a semiconductor wafer may include the formation of trenches. For example, trenches may be formed when a transistor structure is manufactured. The term "dummy trenches" may refer to trenches that are formed in the scribe lines areas in parallel to (or at the same time as) the trenches formed in the active regions of the semiconductor wafer. For example, trenches formed in the active regions may be filled with a dielectric material. Without employing dummy trenches, a uniform deposition of the dielectric material over the semiconductor wafer would result in a convex section of dielectric material formed in the scribe lines. In contrast to this, a formation of the convex section may be avoided by using dummy trenches that may be configured to receive the dielectric material deposited over the scribe line areas. Hence, the dummy trenches may represent inactive structures that may increase the planarity of the semiconductor wafer surface during the manufacturing process.

Devices in accordance with the disclosure may include an encapsulation material that may at least partly cover one or more components of the device. The encapsulation material may be electrically insulating and may form an encapsulation body. The encapsulation material may include any appropriate duroplastic, thermoplastic or thermosetting material, mold compound, or laminate (prepreg). Various techniques may be used to encapsulate the components of the device with the encapsulation material, for example at least one of compression molding, injection molding, powder molding, liquid molding, and lamination. Electrical contacts may protrude from the encapsulation material or may be arranged on an outer surface of the encapsulation material. The electrical contacts may be configured to provide an electrical coupling to components of the device encapsulated by the encapsulation material.

Figure 1A:
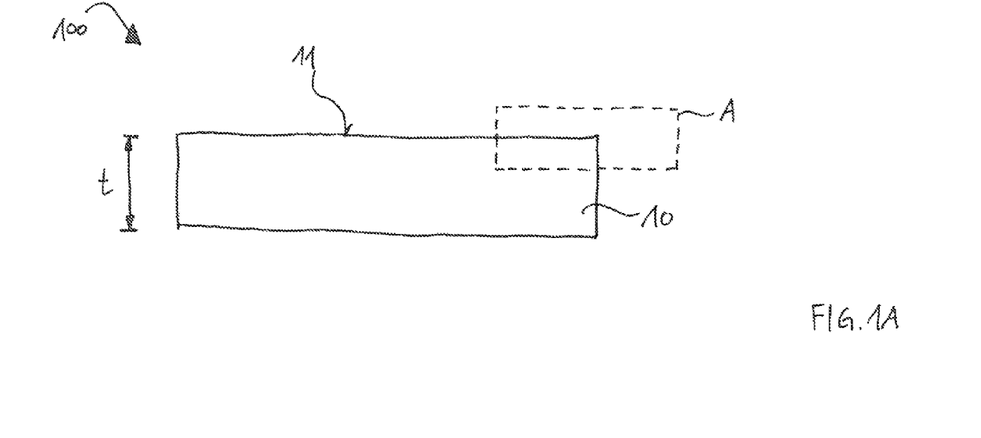
FIG. 1A schematically illustrates a cross-sectional view of a device 100 in accordance with the disclosure.
Figure 1B:
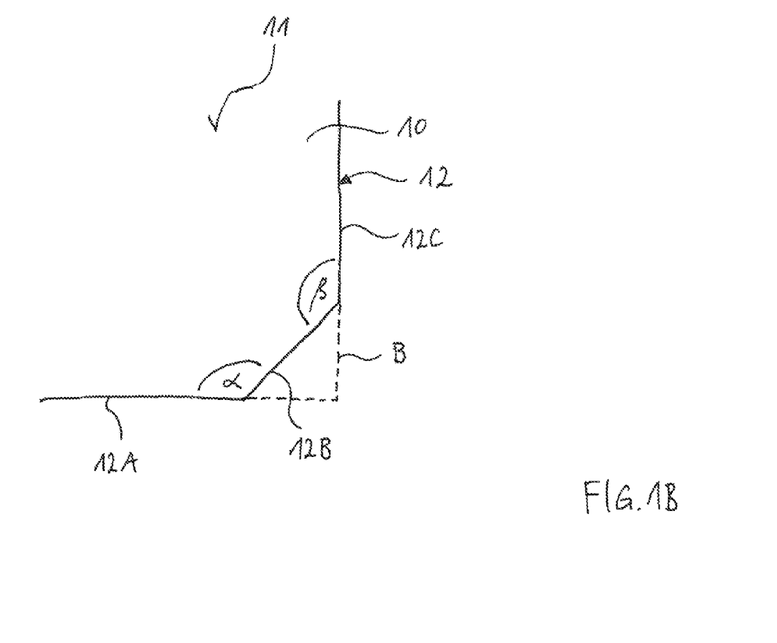
FIG. 1B schematically illustrates an exemplary outline of the frontside of a semiconductor chip included in the device 100.
Figure 1C:
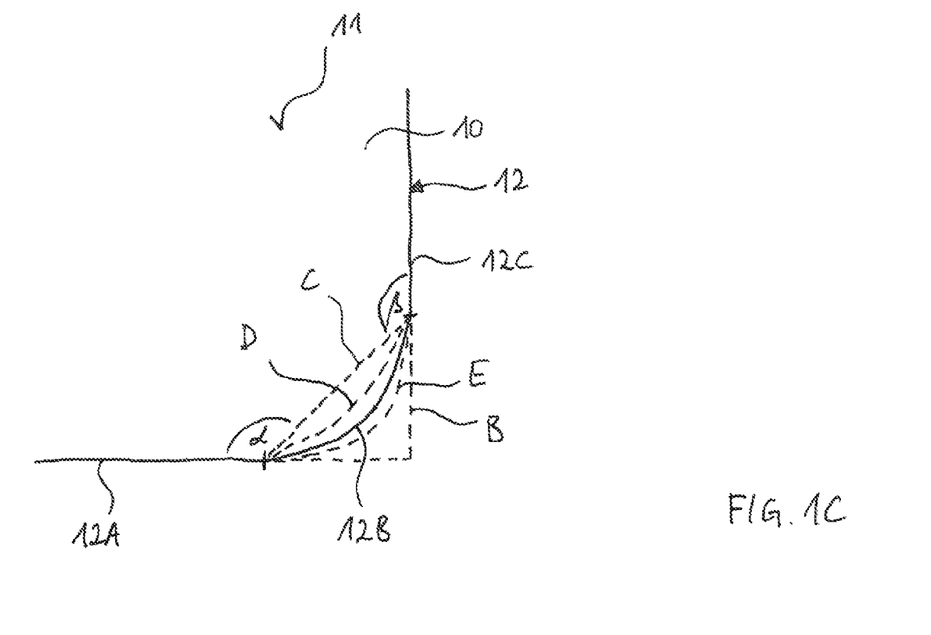
FIG. 1C schematically illustrates a further exemplary outline of the frontside of a semiconductor chip included in the device 100.
Figure 1D:
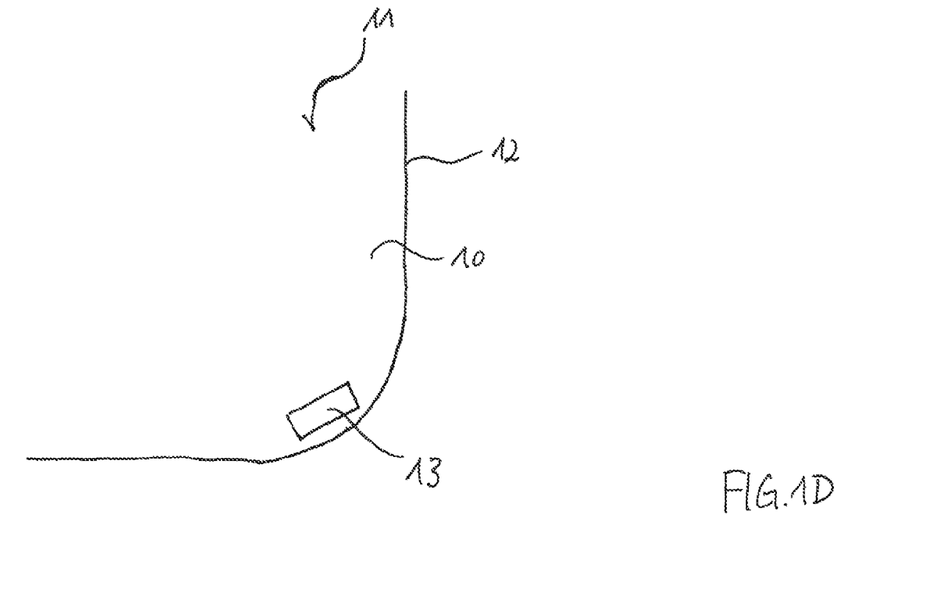
FIG. 1D schematically illustrates a further exemplary outline of the frontside of a semiconductor chip included in the device 100.

FIGS. 1A to 1D schematically illustrate various views and examples of a device in accordance with the disclosure. FIG. 1A schematically illustrates a cross-sectional view of a device 100 in accordance with the disclosure. The device 100 may include a semiconductor chip 10 having a frontside 11. The frontside 11 of the semiconductor chip 10 may include at least one of a doped region, an electrical component and an integrated circuit. The semiconductor chip 10 may be of any of the previously described chip types. In particular, the semiconductor chip 10 may include a power semiconductor chip. A thickness t of the semiconductor chip may particularly be smaller or equal than 100 µm (micrometer). In FIG. 1A, a dashed box A indicates a section of the semiconductor chip 10. Exemplary top views of this section are illustrated in FIGS. 1B to 1D.

FIG. 1B schematically illustrates an exemplary outline (or contour) 12 of the frontside 11 of the semiconductor chip 10 included in the device 100. FIG. 1B does not illustrate the complete outline 12 of the frontside 11, but only a section of the outline 12 associated with the dashed box A of FIG. 1A. The outline 12 of the frontside 11 of the semiconductor chip 10 may include a polygonal line (or polygonal curve) including at least two line segments joined together at an inner angle of greater than 90°. The term "inner" may indicate that the angle is located on the frontside 11 of the semiconductor chip 10.

For example, the outline 12 may include a first line segment 12A, a second line segment 12B and a third line segment 12C. An inner angle α between the first line segment 12A and the second line segment 12B may be greater than 90°. Similarly, an inner angle β between the second line segment 12B and the third line segment 12C may be greater than 90°. For example, α≈135° and β≈135°. The first line segment 12A may be substantially perpendicular to the third line segment 12C.

In FIG. 1B, the outline 12 includes three line segments 12A, 12B, 12C, wherein each pair of connected line segments is joined together with an inner angle of greater than 90°. In further examples, the outline 12 may include an arbitrary number of line segments forming a polygonal line. Here, each pair of connected line segments may also be joined together with an inner angle of greater than 90°. That is, the polygonal line may include an arbitrary number n of line segments, wherein n≥3. The n-th line segment and the (n+1)-th line segment may be joined together at an inner angle greater than 90°. The first line segment and the n-th line segment may be substantially perpendicular to each other.

An outline of a semiconductor chip different from the semiconductor chip 10 of FIG. 1B may include an outline having a corner with an inner angle of 90°. Such outline is indicated in FIG. 1B by a dashed line B. In contrast to the rectangular outline indicated by the dashed line B, the corner of the semiconductor chip 10 in accordance with the disclosure may be beveled as illustrated in FIG. 1B. The beveled outline may reduce a mechanical stress that may occur in the corners of the semiconductor chip 10 during fabrication and/or operation. Further, employing a beveled outline may reduce the surface area of the frontside 11 of the semiconductor chip 10.

FIG. 1C schematically illustrates a further exemplary outline 12 of the frontside 11 of the semiconductor chip 10 included in the device 100. Similar to FIG. 1B, only a part of the complete outline 12 is illustrated. The outline 12 of the frontside 11 of the semiconductor chip 10 may include an arc-shaped (or arch-shaped or bow-shaped or curved) line.

For example, the outline 12 may include a first line segment 12A, a second line segment 12B and a third line segment 12C. The second line segment 12B may correspond to an arc-shaped line. The first line segment 12A may be substantially perpendicular to the third line segment 12C. For illustrative purposes, a dashed straight line C connects an end point of the first line segment 12A with an end point of the third line segments 12C. The dashed line C may thus be similar to the second line segment 12B of FIG. 1B. An inner angle α between the first line segment 12A and the dashed line C may be greater than 90°. Similarly, an inner angle β between the dashed line B and the third line segment 12C may be greater than 90°. For example, α≈135° and β≈135°. Similar to the dashed line B, the arc-shaped line segment 12B may connect the end point of the first line segment 12A with the end point of the third line segments 12C. The curvature of the arc-shaped second line segment 12B may be steady. In this case, the second line segment 12B may e.g. be a section of a circle. Alternatively, the curvature of the arc-shaped second line segment 12B may vary. In FIG. 1C, two further exemplary arc-shaped line segments having different curvatures are illustrated by dashed lines D and E. In particular, the arc-shaped second line segment 12B may be arranged in a triangle formed by the dashed lines B and C.

In FIG. 1C, the outline 12 includes only one arc-shaped line segment 12B. In a further example, the outline 12 may include an arbitrary number of arc-shaped line segments connecting the end point of the first line segment 12A and the end point of the third line segment 12C.

Similar to FIG. 1B, a different outline including an inner angle of 90° is indicated by a dashed line B. In contrast to this rectangular outline, the corner of the semiconductor chip 10 in FIG. 1B may be rounded. The rounded outline 12 may reduce a mechanical stress that may occur during fabrication and/or operation of the semiconductor chip 10. In addition, the rounded outline 12 may reduce the surface area of the frontside 11 of the semiconductor chip 10.

In a further example, the outlines 12 of FIGS. 1B and 1C may be combined to form a further exemplary outline (not illustrated). The further outline may e.g. include a combination of a polygonal line and an arc-shaped line. The combined outline may include an arbitrary number of polygonal lines having an arbitrary number of line segments as well as an arbitrary number of arc-shaped line segments. In particular, the combined outline may be arranged in the triangle formed by the dashed lines B and C.

FIGS. 1B and 1C illustrate only a part of the complete outline 12 of the frontside 11 of the semiconductor chip 10. The complete outline 12 of the frontside 11 may include an arbitrary number of beveled and rounded outline sections, respectively. For example, an outline of a semiconductor chip different to the semiconductor chip 10 may have the shape of a rectangle. A semiconductor chip in accordance with the disclosure may correspond to such semiconductor chip, wherein each of the four corners is beveled or rounded as illustrated in FIGS. 1B and 1C.

FIG. 1D schematically illustrates a further exemplary outline 12 of the frontside 11 of the semiconductor chip 10 included in the device 100. For example, the semiconductor chip 10 may be similar to the semiconductor chip 10 of FIG. 1C. However, the semiconductor chip 10 may also have any other of the previously described outlines in accordance with the disclosure. Compared to FIGS. 1B and 1C, the semiconductor chip 10 additionally includes a structure 13 that may be arranged adjacent to the outline 12. For example, the structure 13 may include at least one of an optically detectable alignment structure and a structure configured to support a measurement of electronic properties of the semiconductor chip 10. Devices in accordance with the disclosure are not restricted to include only one structure 13, but may also include multiple of such structures.

FIGS. 2A to 2D schematically illustrate various views and examples of a device in accordance with the disclosure. The device may be similar to the device described in connection with FIGS. 1A to 1D. The description made in connection with FIGS. 1A to 1D may thus also hold true for FIGS. 2A to 2D and vice versa.

Figure 2A:
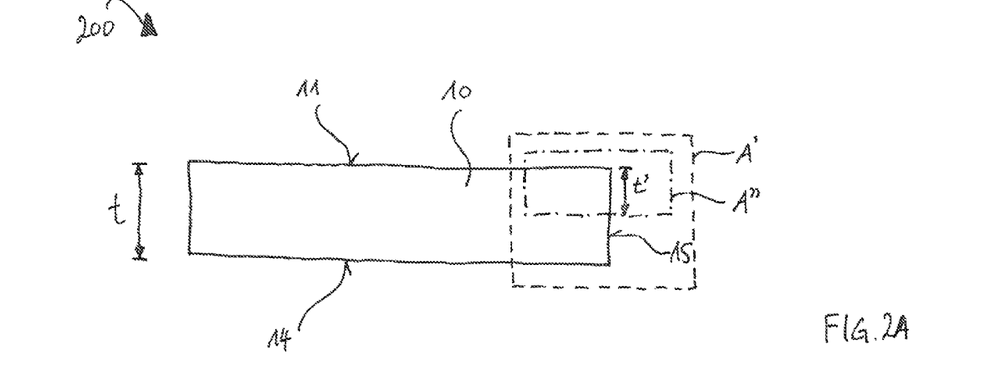
FIG. 2A schematically illustrates a cross-sectional view of a further device 200 in accordance with the disclosure.

FIG. 2A schematically illustrates a cross-sectional view of a semiconductor device 200 in accordance with the disclosure. The device 200 may include a semiconductor chip 10 having a frontside 11, a backside 14 and a side surface 15 extending from the backside 14 to the frontside 11. In FIG. 2A, the side surface 15 is indicated by a simple line. More detailed exemplary illustrations of the side surface 15 are given in FIGS. 2B to 2D. The frontside 11 of the semiconductor chip 10 may include at least one of a doped region, an electrical component and an integrated circuit. The semiconductor chip 10 may be of any of the previously described chip types. In particular, the semiconductor chip 10 may include a power semiconductor chip. A thickness t of the semiconductor chip may particularly be smaller or equal than 100 μm (micrometer). In FIG. 2A, a dashed box A' and a dot-dashed box A" indicate sections of the semiconductor chip 10. Exemplary side views of these sections are illustrated in FIGS. 2B to 2D.

Figure 2B:
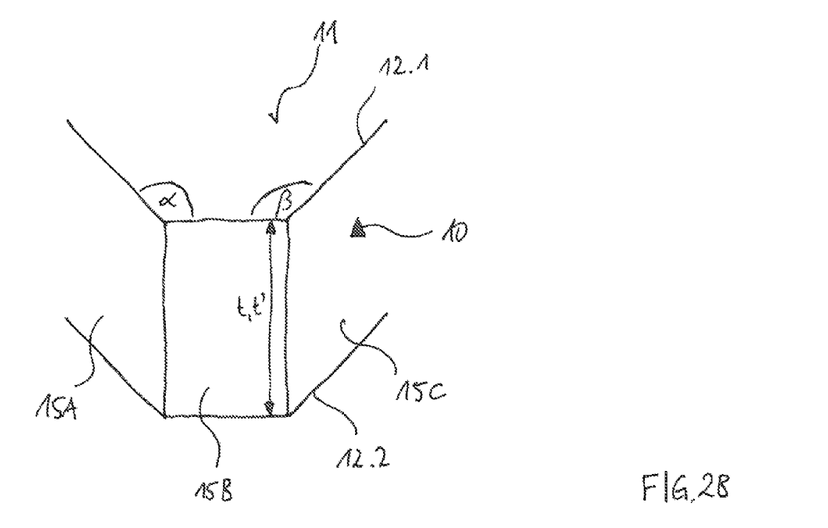
FIG. 2B schematically illustrates an exemplary side surface of a semiconductor chip included in the device 200.
Figure 2C:
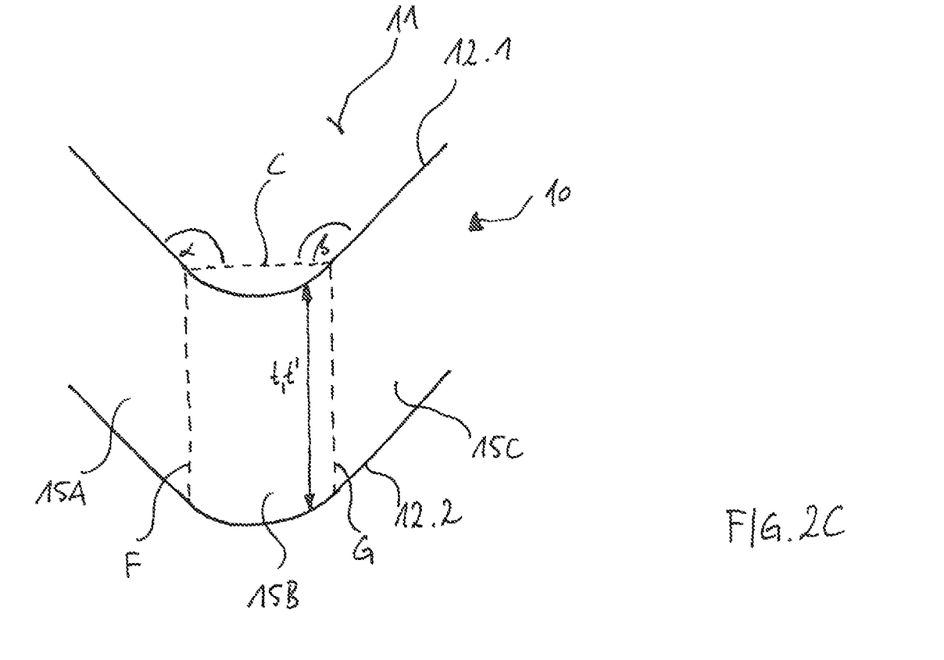
FIG. 2C schematically illustrates a further exemplary side surface of a semiconductor chip included in the device 200.
Figure 2D:
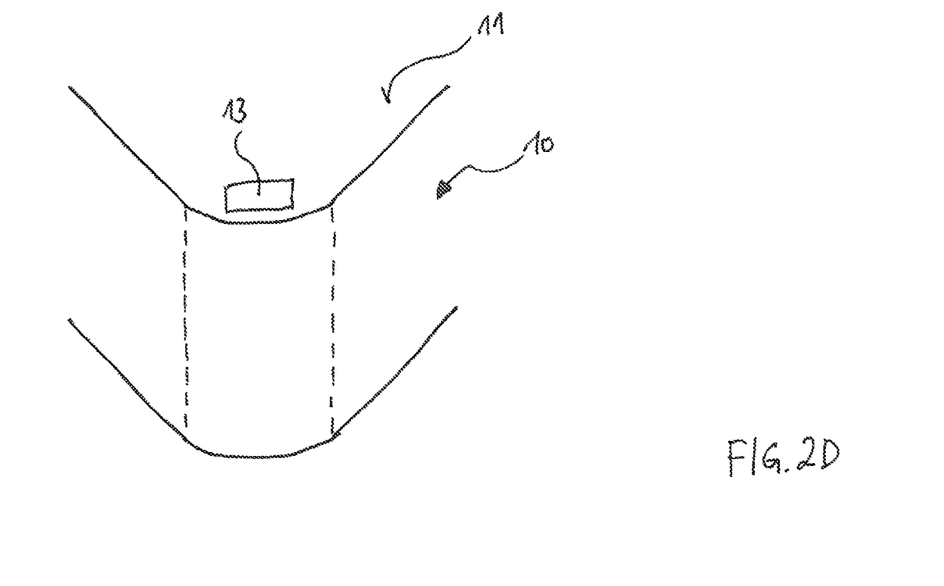
FIG. 2D schematically illustrates a further exemplary side surface of a semiconductor chip included in the device 200.

FIG. 2B schematically illustrates an exemplary side view of the device 200. FIG. 2B does not illustrate the complete semiconductor chip 10, but only a section of the semiconductor chip 10 associated with the dashed box A' or the dot-dashed box A" in FIG. 2A. The side surface 15 may include at least one edge having an inner angle of greater than 90°.

For example, the side surface 15 may include a first surface 15A, a second surface 15B and a third surface 15C. Except for possible undulations and/or defects, each of the surfaces 15A to 15C may be substantially planar. An inner angle α between the first surface 15A and the second surface 15B may be greater than 90°. Similarly, an inner angle β between the second surface 15B and the third surface 15C may be greater than 90°. For example, α≈135° and β≈135°. The first surface 15A may be substantially perpendicular to the third surface 15C. For the case of the illustrated section being associated with the dashed box A' of FIG. 2A, a height of the second surface 15B may correspond to the thickness t of the semiconductor chip 10. For the case of the illustrated section being associated with the dot-dashed box A" of FIG. 2A, a height t' of the second surface 15B may be smaller than the thickness t of the semiconductor chip 10. In this case, the side surface (not shown) of the semiconductor chip 10 arranged below the second surface 15B may have a rectangular corner similar to a conventional semiconductor chip of rectangular shape. The different shapes of the semiconductor chip 10 associated with the lines A' and A" may be realized by choosing a respective etching time (for the case of etching, plasma etching, etc.) or a respective focal point of a laser used for separating the semiconductor chip 10 from a semiconductor wafer (for the case of laser dicing). An outline 12.1 of the frontside 11 of the semiconductor chip 10 may be similar to the outline 12 in FIG. 1B. In addition, the outline 12.2 of the backside 14 of the semiconductor chip 10 may also be similar to the outline 12 shown in FIG. 1B. The surfaces 15A to 15C may be arranged substantially perpendicular to the frontside 11 and the backside 14 of the semiconductor chip 10, respectively.

In the example of FIG. 2B, the side surface 15 of the semiconductor chip 10 includes three surfaces 15A, 15B, 15C, wherein each pair of connected surfaces is joined together with an inner angle of greater than 90°. Accordingly, the semiconductor chip 10 may include two edges having an inner angle of greater than 90°. In a further example, the side surface 15 may include an arbitrary number of surfaces similar to the surfaces 15A, 15B, 15C (and associated edges), wherein each pair of connected surfaces may be joined together with an inner angle of greater than 90°. In this case, the outlines of the frontside 11 and the backside 14 of the semiconductor chip 10 may be a polygonal line having a corresponding number of line segments as described in connection with FIG. 1B.

A semiconductor chip different from the semiconductor chip 10 of FIG. 2B may be rectangular-shaped (or cube-shaped) including lateral edges having an inner angle of 90°. In contrast to such rectangular edges, the corner region of the semiconductor chip 10 in FIG. 1B is beveled. The beveled shape may reduce a mechanical stress that may occur during a fabrication and/or operation of the semiconductor chip 10.

FIG. 2C schematically illustrates a further exemplary side view of the semiconductor chip 10 included in the device 200. Similar to FIG. 2B, only a part of the complete semiconductor chip 10 is illustrated. The side surface 15 of the semiconductor chip 10 may include a curved surface.

For example, the side surface 15 may include a first surface 15A, a second surface 15B and a third surface 15C. Except for possible undulations and/or defects, the first surface 15A and the third surface 15C may be substantially planar while the second surface 15B may be curved. The first surface 15A may be substantially perpendicular to the third surface 15C. The height of the second surface 15B may again correspond to a value of t or t' (see FIGS. 2A and 2B). The outline 12.1 of the frontside 11 of the semiconductor chip 10 may be similar to the outline 12 in FIG. 1C. In addition, the outline 12.2 of the backside 14 of the semiconductor chip 10 may be similar to the outline 12 in FIG. 1C. Each of the surfaces 15A to 15C may be substantially perpendicular to the frontside 11 and the backside 14 of the semiconductor chip 10.

For illustrative purposes, a transition between the first surface 15A and the second surface 15B and a transition between the second surface 15B and the third surface 15C is indicated by dashed lines F and G. In one example, one or both transition(s) may include a lateral edge. In a further example, one or both transition(s) may be smooth. A straight dashed line C connects an end point of dashed line F with an end point of the dashed line G. An inner angle α between the upper edge of the first surface 15A and the dashed line C may be greater than 90°. Similarly, an inner angle β between the dashed line C and the upper edge of the third surface 15C may be greater than 90°. For example, α≈135° and β≈135°. The upper edge of the curved second surface 15B may connect the end points of the dashed lines F and G. The curvature of the second surface 15B may be steady or may vary.

In the example of FIG. 2C, the side surface 15 includes only one curved surface 15B. In a further example, the side surface 15 may include an arbitrary number of curved side surfaces connecting the dashed lines F and G.

A semiconductor chip different from the semiconductor chip 10 of FIG. 2C may be rectangular-shaped (or cube-shaped) including lateral edges having an inner angle of about 90°. In contrast to such lateral edges, the corner region of the semiconductor chip 10 in FIG. 2C is rounded. The rounded shape may reduce a mechanical stress that may occur during a fabrication and/or operation of the semiconductor chip 10.

The side surfaces of FIGS. 2B and 2C may be combined to form a further exemplary side surface of the semiconductor chip 10. The further exemplary side surface may include a combination of an arbitrary number of curved surfaces as described in connection with FIG. 2C and an arbitrary number of edges having an inner angle of greater than 90° as described in connection with FIG. 2B.

FIGS. 2B and 2C merely illustrate a part of the complete semiconductor chip 10. The complete semiconductor chip 10 may include an arbitrary number of beveled and rounded sections as described in connection with FIGS. 2B and 2C. For example, a further exemplary semiconductor chip (not illustrated) may be substantially rectangular-shaped or cubic-shaped, wherein each corner may be beveled or rounded as illustrated in FIGS. 2B and 2C.

FIG. 2D schematically illustrates a further exemplary semiconductor chip 10 that may be included in the device 200. The semiconductor chip 10 may be similar to the semiconductor chip 10 of FIG. 2C, but may also be similar to any other semiconductor chip in accordance with the disclosure. Compared to FIGS. 2B and 2C, the semiconductor chip 10 of FIG. 2D includes an additional structure 13 that may be arranged on the frontside 11 of the semiconductor chip 10. For example, the structure 13 may include at least one of an optically detectable alignment structure and a structure configured to support a measurement of electronic properties of the semiconductor chip 10. The semiconductor chip 10 may include an arbitrary number of such structures 13.

The semiconductor chips 10 of FIGS. 2A to 2D may be manufactured by any suitable technique. In this connection, at least a part of the side surface 15 may be etched, plasma etched, or laser diced. An exemplary method for manufacturing devices in accordance with the disclosure is described in connection with FIGS. 3A to 3E. The side surface 15 of the semiconductor chip 10 may include defects extending from the side surface 15 into the semiconductor chip 10, wherein the defects may have a dimension smaller than about 20 µm (micrometer). Further, the side surface 15 may include an undulation, wherein the undulation may have an amplitude from about 100 nanometers to about 5 µm (micrometer).

Figure 3A:
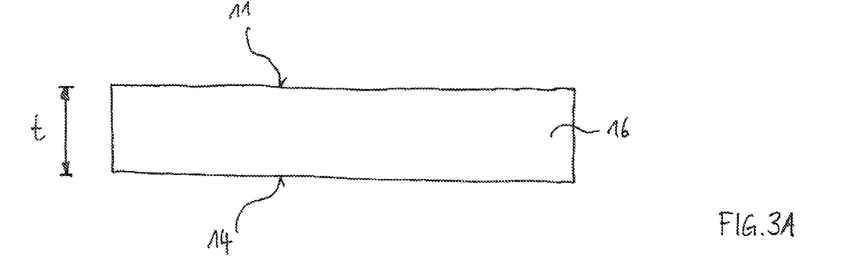
FIGS. 3A to 3E schematically illustrate an exemplary method for manufacturing a device 300 in accordance with the disclosure.
Figure 3B:
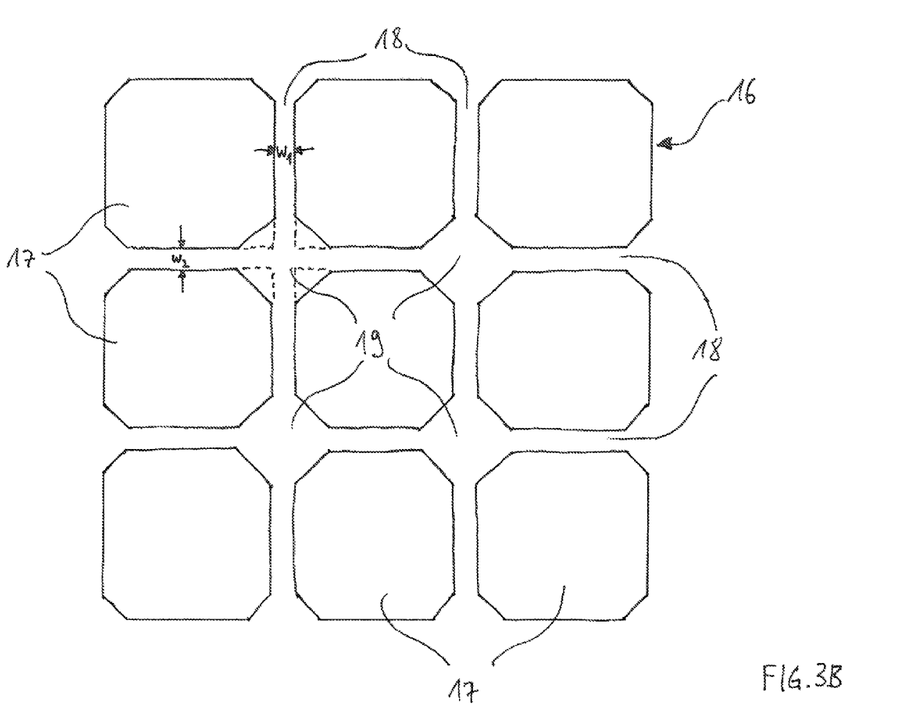
Figure 3C:
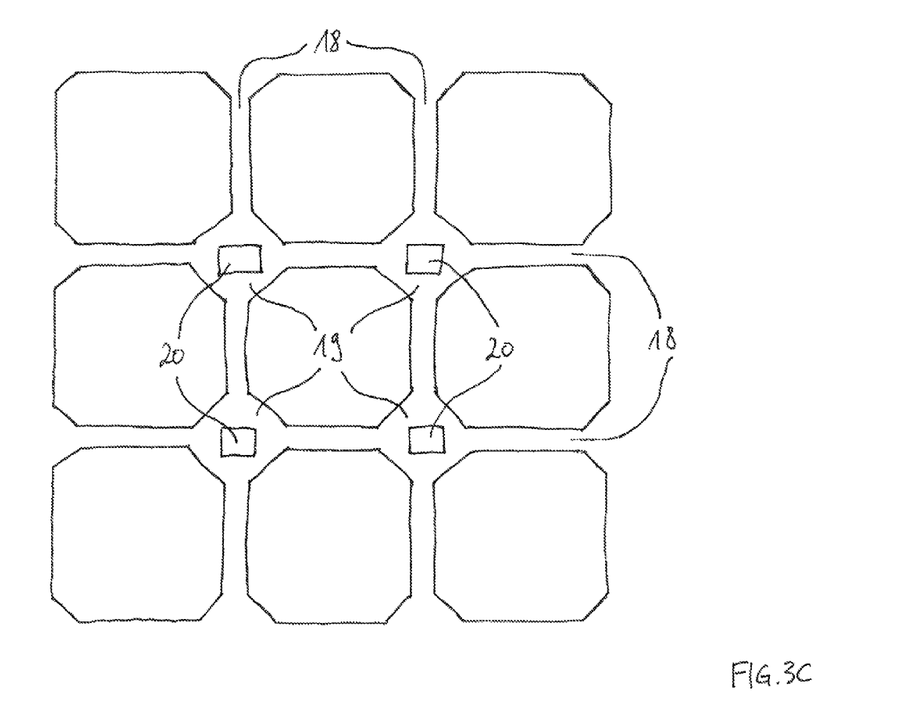
Figure 3D:
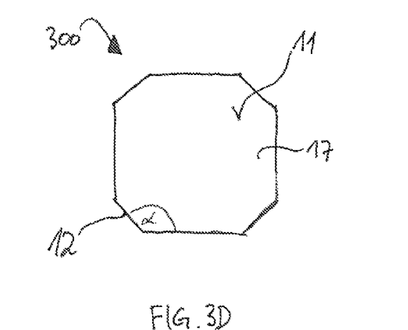
Figure 3E:
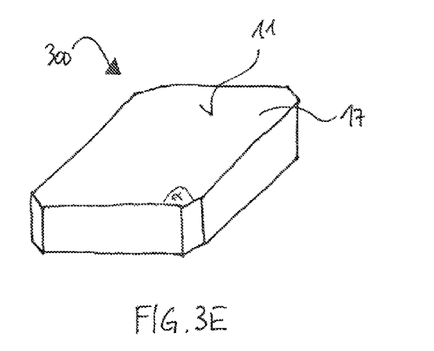

FIGS. 3A to 3E schematically illustrate a method for manufacturing a device in accordance with the disclosure. A top view and a side view of a device 300 obtained by the described method is shown in FIGS. 3D and 3E, respectively.

In FIG. 3A, a semiconductor wafer 16 having a frontside 11 and a backside 14 may be provided. The semiconductor wafer 16 may be made of an arbitrary semiconductor material and may have arbitrary dimensions. In one example, a thickness t of the semiconductor wafer 16 may be smaller or equal than 100 µm (micrometer). In a further example, the thickness t of the semiconductor wafer 16 may be greater than 100 µm (micrometer), and the semiconductor wafer 16 may be thinned to a thickness smaller or equal than 100 µm (micrometer) later on by removing semiconductor material from the backside 14 of the semiconductor wafer 16.

FIG. 3B illustrates a top view of a part of the semiconductor wafer 16. One or more semiconductor chips (or dies) 17 may be formed on the semiconductor wafer 16. For the sake of simplicity, only nine semiconductor chips 17 are shown. However, the actual number of semiconductor chips 17 formed on the semiconductor wafer 16 may be arbitrary. Manufacturing the semiconductor chips 17 and integrated circuits included therein may include at least one of doping, ion implantation, deposition of materials, photolithographic patterning, etc. Scribe lines 18 may be formed on the frontside 11 of the semiconductor wafer 16. The scribe lines 18 may indicate locations where the semiconductor wafer 16 is to be separated into the individual semiconductor chips 17 later on.

In the example of FIG. 3B, the scribe lines 18 may form a substantially rectangular lattice dividing the semiconductor wafer 16 into the multiple semiconductor chips 17. In further examples, the lattice may have a different form, for example a diamond pattern. In the example of FIG. 3B, the scribe lines 18 are illustrated as straight lines. However, the scribe lines 18 may also be of different shape. For example, one or more of the scribe lines 18 may be curved, wavelike, undulated, etc. The scribe lines 18 may be formed between the semiconductor chips 17 and may intersect at crossings 19. The scribe lines 18 may be formed such that an outline of the semiconductor chips 17 may include a polygonal line including two line segments joined together at an inner angle of greater than 90°. That is, the corners of the semiconductor chips 17 may be beveled. For example, the outline of the semiconductor chips 17 may be similar to the outline 12 of the semiconductor chip in FIG. 1B. The description made in connection with FIG. 1B may therefore also hold true for FIG. 3B.

In a further example, the scribe lines 18 may be formed such that an outline of the semiconductor chips 17 may include an arc-shaped line. The outline of the semiconductor chips 17 may thus be similar to the outline 12 in FIG. 1C. In yet a further example, the outline of the semiconductor chips 17 may include a combination of at least one polygonal line including two line segments joined together at an inner angle of greater than 90° and at least one arc-shaped line.

At a semiconductor wafer different from the semiconductor wafer 16 of FIG. 3B (not illustrated), the scribe lines 18 may be arranged such that the corners of the semiconductor chips 17 may be rectangular at the crossings 19. Such arrangement is indicated by dashed lines at the crossing 19 on the top left side of FIG. 3B, where the crossing 19 between the scribe lines 18 may be similar to a rectangle. For example, a first scribe line 18 may have a width $w_1$, and a second scribe line 18 may have a width $w_2$ such that a surface area of the rectangular crossing may correspond to a product of the first width $w_1$ and the second width $w_2$. As can be seen from FIG. 3B, the surface area of the rectangle is smaller than the surface area of the crossing formed by the semiconductor chips 17 having a beveled outline.

In FIG. 3C, one or more (sacrificial) structures 20 may be arranged in one or more of the scribe lines 18 and/or in one or more of the crossings 19. For the sake of simplicity, only structures 20 in the crossings 19 are illustrated. In the example of FIG. 3C, the structures 20 have an exemplary rectangular form. However, the shapes and the arrangement of the structures 20 may be arbitrary. For example, the rectangular structures 20 in FIG. 3C may be rotated by an arbitrary angle. In further examples, one or more of the structures 20 may have the shape of a circle, a stripe, a square, a trapezoid, etc. In addition, the number and exact positioning of the structures 20 may be arbitrary. Due to the beveled outline of the semiconductor chips 17, the area available for forming the structures 20 may be increased compared to a semiconductor wafer including semiconductor chips of rectangular shape. Due to the increased area, it may be possible to arrange structures 20 in the crossings 19 that may usually be arranged in the scribe lines 18 between the individual semiconductor chips 17. In one example, the semiconductor wafer 16 may exclusively include structures 20 in the crossings 19, but not in the scribe lines 18 between the individual semiconductor chips 17. In this case, the width of the scribe lines may be reduced to a width that may be smaller than typical dimensions of the structures 20.

A structure 20 may include one or more sacrificial structures. In one example, the structure 20 may include a monitoring structure that may, for example, include a PCM structure. In a further example, the structure 20 may include one or more auxiliary structures that may, for example, include at least one of an optically detectable alignment structure and a dummy trench. In yet another example, the structures 20 may include an arbitrary combination of the previously mentioned structures.

In a further act, the semiconductor wafer 16 maybe separated into multiple semiconductor chips 17 (or devices 300). Exemplary devices 300 are shown in FIGS. 3D and 3E. Separating the semiconductor chips 17 may include at least one of an etching process, a plasma etching process, a laser dicing process, etc. In particular, a technique for separating the semiconductor chips 17 may be configured to separate the semiconductor chips 17 along the scribe lines 18. When the semiconductor chips 17 are separated along the scribe lines 18, the structures 20 may be partly or completely destroyed such that the structures 20 are not necessarily included in the semiconductor chips 17 after the separation.

FIG. 3D illustrates a top view of an exemplary separated device 300. An outline 12 of the frontside 11 of the semiconductor chip 17 may include a polygonal line including two line segments joined together at an inner angle $\alpha$ of greater than 90°. The semiconductor chip 17 may e.g. be similar to the semiconductor chip 10 of FIG. 1B. In a further example, an outline 12 of the frontside 11 of the semiconductor chip 17 may include an arc-shaped line. Here, the semiconductor chip 17 may be similar to the semiconductor chip 10 of FIG. 1C. In yet another example, an outline of the frontside of the semiconductor chip 17 may include a combination of an polygonal line including two line segments joined together at an inner angle of greater than 90° and an arc-shaped line. In general, the semiconductor chip 17 of the device 300 may be similar to any of the previously described semiconductor chips in accordance with the disclosure. Comments made in connection with foregoing Figures may thus also hold true for the device 300.

FIG. 3E illustrates a side view of an exemplary separated device 300. A side surface of the semiconductor chip 17 may include at least one edge having an inner angle $\alpha$ of greater than 90°. The semiconductor chip 17 may e.g. be similar to the semiconductor chip 10 of FIG. 2B. In a further example, a side surface of the semiconductor chip 17 may include a curved surface. In this case, the semiconductor chip 17 may be similar to the semiconductor chip 10 of FIG. 2C. In yet another example, a side surface of the semiconductor chip 17 may include both a curved surface and an edge having an inner angle of greater than 90°.

The described method may include further acts which are not explicitly illustrated herein. In an optional act, the device 300 may be assembled with further electronic components.

In a further optional act, the device 300 or an assembly including the device 300 may be encapsulated by an encapsulation material. In a further optional act, one or more structures 13 as described in connection with FIGS. 1D and 2D may be formed on the frontside 11 of the semiconductor chip 17.

The sequential order of the acts described in connection with FIGS. 3A to 3E may be exchanged if technically possible. Also, at least two of the described acts may be performed at least partly at the same time. For example, the act of forming the semiconductor chips 17 on the semiconductor wafer 16 (see FIG. 3B) may be performed before or after or at least partly at the same time as the act of forming the sacrificial structures 20 (see FIG. 3C).

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although specific examples have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein. Therefore, it is intended that this disclosure be limited only by the claims and the equivalents thereof.

What is claimed is:

1. A device, comprising:
   a semiconductor chip, wherein an outline of a frontside of the semiconductor chip comprises at least one of a polygonal line comprising two line segments joined together at an inner angle of greater than 90° and an arc-shaped line;
   a structure arranged over the frontside of the semiconductor chip and adjacent to the at least one of a polygonal line and an arc-shaped line, the structure comprising at least one of an optically detectable alignment structure and a structure configured to support a measurement of electronic properties of the semiconductor chip.

2. The device of claim 1, wherein the frontside of the semiconductor chip comprises at least one of a doped region, an electrical component, and an integrated circuit.

3. The device of claim 1, wherein the semiconductor chip comprises a backside and a side surface extending from the backside to the frontside, wherein the side surface comprises at least one of a curved surface and an edge having an inner angle of greater than 90°.

4. The device of claim 1, wherein the semiconductor chip comprises a backside and a side surface extending from the backside to the frontside, wherein at least a part of the side surface is etched, plasma etched, or laser diced.

5. The device of claim 1, wherein the semiconductor chip comprises a backside and a side surface extending from the backside to the frontside, wherein defects extending from the side surface into the semiconductor chip have a dimension smaller than 20 micrometers.

6. The device of claim 1, wherein the semiconductor chip comprises a backside and a side surface extending from the backside to the frontside, wherein the side surface comprises an undulation having an amplitude between 100 nanometers and 5 micrometers.

7. The device of claim 1, wherein a thickness of the semiconductor chip is smaller than or equal to 100 micrometers.

8. The device of claim 1, wherein the semiconductor chip comprises a power semiconductor.

9. A device, comprising:
   a semiconductor chip comprising a frontside, a backside and a side surface extending from the backside to the frontside, wherein the side surface and the frontside form a right-angled joint edge, wherein the side surface comprises an edge having an inner angle of greater than 90°, wherein the edge having an inner angle of greater than 90° is perpendicular to the frontside and distant from the backside, and wherein a height of the edge having an inner angle of greater than 90° is smaller than a thickness of the semiconductor chip;
   wherein the side surface comprises a further edge having an inner angle of 90°, wherein the further edge is perpendicular to the backside and distant from the frontside.

10. The device of claim 9, wherein the side surface and the backside form a right-angled joint edge.

11. The device of claim 9, wherein a sum of the height of the edge having an inner angle of greater than 90° and a height of the further edge having an inner angle of 90° equals the thickness of the semiconductor chip.

12. The device if claim 9, wherein a surface of the frontside is smaller than a surface area of the backside.

* * * * *